United States Patent
Familier et al.

(10) Patent No.: US 12,063,049 B2
(45) Date of Patent: Aug. 13, 2024

(54) TIME-TO-DIGITAL CONVERTER AND CALIBRATION

(71) Applicant: Anokiwave, Inc., San Diego, CA (US)

(72) Inventors: Eythan Familier, San Diego, CA (US); Kartik Sridharan, San Diego, CA (US); Jun Li, San Diego, CA (US); Gaurav Menon, San Marcos, CA (US); Shamsun Nahar, San Diego, CA (US); Akhil Garlapati, San Diego, CA (US); Scott Humphreys, Greensboro, NC (US); Antonio Geremia, San Diego, CA (US)

(73) Assignee: Anokiwave, Inc., San Diego, CA (US)

(*) Notice: Subject to any disclaimer, the term of this patent is extended or adjusted under 35 U.S.C. 154(b) by 235 days.

(21) Appl. No.: 17/683,916

(22) Filed: Mar. 1, 2022

(65) Prior Publication Data

US 2022/0286140 A1 Sep. 8, 2022

Related U.S. Application Data

(60) Provisional application No. 63/155,374, filed on Mar. 2, 2021.

(51) Int. Cl.
| | | |
|---|---|---|
| H03M 1/10 | (2006.01) | |
| G04F 10/00 | (2006.01) | |
| H03L 7/197 | (2006.01) | |

(52) U.S. Cl.
CPC ........ *H03M 1/1028* (2013.01); *G04F 10/005* (2013.01); *H03L 7/1976* (2013.01)

(58) Field of Classification Search
CPC ...... G04F 10/005; G04F 10/105; H03M 1/82; H03M 1/1009; H03M 1/1014; H03M 1/84; H03M 1/201; H03M 1/002; H03M 1/0624; H03M 1/0641; H03M 1/1004; H03M 1/1023; H03M 1/1028; H03M 1/1033;

(Continued)

(56) References Cited

U.S. PATENT DOCUMENTS

| | | | | |
|---|---|---|---|---|
| 7,932,847 B1 * | 4/2011 | Hsieh | ................. | G04F 10/005 |
| | | | | 341/155 |
| 8,222,966 B2 * | 7/2012 | Ravi | ................. | H03C 3/10 |
| | | | | 375/302 |

(Continued)

*Primary Examiner* — Linh V Nguyen
(74) *Attorney, Agent, or Firm* — Nutter McClennen & Fish LLP

(57) ABSTRACT

Digital post-processing of time-to-digital converter (TDC) output data can be used to map each TDC code to the ideal one, but this requires knowing the TDC input-output mapping. Therefore, a calibration system and method are provided for characterizing operation of a TDC to compensate for non-idealities. Input signals having a known time difference are provided to the TDC, and a mapping between the TDC output and the known time difference is stored in a mapping table. With the described method, it is possible to input an input ramp of very low slope to construct this mapping to a desired resolution during a background calibration procedure. This characterizing and mapping can be performed across a range of input signals having different known time differences. After calibration, a mapping table can be used by a mapping circuit of the TDC or by a digital post-processing function to provide a compensated TDC output.

21 Claims, 13 Drawing Sheets

(58) Field of Classification Search
CPC ............ H03M 1/1042; H03M 1/1061; H03M 1/1071; H03M 1/1215; H03M 1/122; H03M 1/1295; H03M 1/14; H03M 1/18; H03M 1/361; H03M 1/38; H03M 1/466; H03M 1/56; H03M 1/66; H03M 1/662; H03M 1/68; H03M 1/785; H03M 1/825; H04B 1/0475; H04B 17/21; H04B 1/02; H04B 2001/0425; H04B 1/40; H04B 1/62; H04B 1/7073; H04B 2001/6912; H04B 2201/7073; H04B 7/10
USPC .................................................. 341/118–121
See application file for complete search history.

(56) References Cited

U.S. PATENT DOCUMENTS

| | | | |
|---|---|---|---|
| 8,497,716 B2 * | 7/2013 | Zhang | H03L 7/1976 327/147 |
| 9,191,613 B2 | 11/2015 | Silver et al. | |
| 9,225,507 B1 | 12/2015 | Lye et al. | |
| 9,323,226 B1 * | 4/2016 | Waltari | G04F 10/005 |
| 9,520,890 B1 * | 12/2016 | Ben-Bassat | H03M 1/1014 |
| 9,791,834 B1 * | 10/2017 | Nassar | G04F 10/005 |
| 10,116,315 B1 | 10/2018 | Zhuang et al. | |
| 10,243,573 B1 | 3/2019 | Goyal et al. | |
| 10,459,407 B1 * | 10/2019 | Degani | H03M 1/1009 |
| 10,725,433 B2 | 7/2020 | Fujimoto | |
| 11,296,860 B2 | 4/2022 | Sridharan et al. | |
| 11,809,141 B2 | 11/2023 | Sridharan et al. | |
| 2011/0255612 A1 | 10/2011 | Bernstein et al. | |
| 2012/0076180 A1 | 3/2012 | Hoshino | |
| 2015/0074156 A1 * | 3/2015 | Degani | H03L 7/085 702/180 |
| 2016/0080138 A1 | 3/2016 | Biederman | |
| 2016/0294541 A1 | 10/2016 | van de Beek et al. | |
| 2017/0324419 A1 | 11/2017 | Mayer et al. | |
| 2019/0058481 A1 * | 2/2019 | Gao | H03L 7/0992 |
| 2019/0386663 A1 * | 12/2019 | Candler | G04F 10/005 |
| 2022/0278690 A1 * | 9/2022 | Shumaker | H03L 7/24 |
| 2022/0393690 A1 * | 12/2022 | Banin | H03L 7/081 |
| 2023/0018398 A1 * | 1/2023 | Whitcombe | H03K 5/06 |

* cited by examiner

Ideal

Actual

TIME-TO-DIGITAL CONVERTER AND CALIBRATION

CROSS-REFERENCE TO RELATED APPLICATION(S)

This patent application claims the benefit of U.S. Provisional Patent Application No. 63/155,374 entitled CALIBRATING A TIME-TO-DIGITAL CONVERTER filed Mar. 2, 2021, which is hereby incorporated herein by reference in its entirety.

The subject matter of this patent application may be related to the subject matter of commonly-owned U.S. Patent Application No. 62/875,984 entitled PHASE-ALIGNING MULTIPLE SYNTHESIZERS filed on Jul. 19, 2019, and U.S. patent application Ser. No. 16/932,187 PHASE-ALIGNING MULTIPLE SYNTHESIZERS filed on Jul. 17, 2020 published as U.S. Patent Application Publication No. US 2021/0021402, both of which are hereby incorporated herein by reference in their entireties.

The subject matter of this patent application also may be related to the subject matter of commonly-owned U.S. Patent Application No. 63/155,376 entitled TIME-TO-DIGITAL CONVERTER USING VOLTAGE AS A REPRESENTATION OF TIME OFFSET filed on Mar. 2, 2021, which is hereby incorporated herein by reference in its entirety.

FIELD OF THE INVENTION

The invention generally relates to calibration of a time-to-digital converter (TDC).

BACKGROUND OF THE INVENTION

A time-to-digital converter (TDC) captures the time difference between two signals and produces a digital output value representative of the time difference. One common type of TDC is the Vernier delay line (VDL) type of time-to-digital converter (TDC).

SUMMARY OF VARIOUS EMBODIMENTS

In accordance with one embodiment of the invention, a time-to-digital converter (TDC) calibration system comprises an interface to a time-to-digital converter (TDC); a controllable signal generator configured to provide, via the interface, at least one pair of calibration signals to the TDC, each pair of calibration signals having a known time difference; and a calibration mapping circuit configured to receive, via the interface, a digital TDC output value for each pair of calibration signals and to store in a digital memory, for each pair of calibration signals, a mapping value for converting the digital TDC output value to a corresponding digital time value associated with the known time difference.

In accordance with another embodiment of the invention, a time-to-digital converter (TDC) calibration method comprises providing, by a controllable signal generator, at least one pair of calibration signals to a time-to-digital converter (TDC), each pair of calibration signals having a known time difference; receiving, by a calibration mapping circuit, a digital TDC output value for each pair of calibration signals; and storing, by the calibration mapping circuit, in a digital memory, a mapping value for converting the digital TDC output value to a corresponding digital time value associated with the known time difference.

In various alternative embodiments, the digital TDC output value may be a time value or, in the case where the TDC captures the time difference between the two signals as a voltage, the digital TDC output value may be a voltage value. The controllable signal generator may be a fractional-N phased-lock loop or may include a reference signal generator configured to output a reference signal as a first signal provided to the time-to-digital converter and a delay circuit configured to output a delayed version of the reference signal as a second signal provided to the time-to-digital converter. The calibration mapping circuit may be configured to store the known time difference as the mapping value such that the known time difference can be obtained using the digital TDC output value or may be configured to store a compensation value based on the known time difference and the digital TDC output value as the mapping value such that the compensation value can be obtained using the digital TDC output value. The controllable signal generator may be configured to provide multiple pairs of calibration signals having different known time differences to the TDC. The TDC may be implemented in an integrated circuit and the calibration mapping circuit may be configured to store the mapping values in a digital memory of the integrated circuit. The calibration mapping circuit may be configured to store the mapping value for each pair of calibration signals in a mapping table such that the mapping table can be indexed by a subsequent digital TDC output value to retrieve the stored mapping value.

In accordance with another embodiment of the invention, a time-to-digital conversion system comprises a time-to-digital converter (TDC) that outputs a digital TDC output value based on two input signals having an unknown time difference; and digital post-processing circuitry coupled to receive the digital TDC output value from the TDC, retrieve from a digital memory a mapping value corresponding to the digital TDC output value based on the digital TDC output value, and output a compensated digital time value based on the mapping value, wherein the compensated digital time value is representative of the unknown time difference between the two input signals.

In accordance with another embodiment of the invention, a time-to-digital conversion method comprises receiving, from a time-to-digital converter (TDC), a digital TDC output value based on two input signals having an unknown time difference; retrieving, from a digital memory, a mapping value corresponding to the digital TDC output value based on the digital TDC output value; and outputting a compensated digital time value based on the mapping value, wherein the compensated digital time value is representative of the unknown time difference between the two input signals.

In various alternative embodiments, the digital TDC output value may be a time value or, in the case where the TDC captures the time difference between the two signals as a voltage, the digital TDC output value may be a voltage value. The mapping value retrieved from the digital memory may be a known time difference corresponding to the digital TDC output value and the digital post-processing circuitry may be configured to output the retrieved known time difference as the compensated digital time value. Alternatively, the mapping value retrieved from the digital memory may be a compensation value corresponding to the digital TDC output value and the digital post-processing circuitry may be configured to output the compensated digital time value as a function of the digital TDC output value and the retrieved compensation value. The mapping values may be stored in a mapping table that is indexed by the digital TDC output value to retrieve the stored mapping value. The TDC and digital post-processing circuitry may be implemented in an integrated circuit.

In any of the above potential claims, the calibration and mapping process can be performed for multiple operational parameters such as temperature, voltage, etc., such that there are different mapping tables for different operational parameters. Then, for example, in order to provide a compensated digital time value, the proper mapping table can be selected based on the operational parameter and then the mapping value can be obtained using the digital TDC output value.

Additional embodiments may be disclosed and claimed.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

It should be noted that the foregoing figures and the elements depicted therein are not necessarily drawn to consistent scale or to any scale. Unless the context otherwise suggests, like elements are indicated by like numerals.

DESCRIPTION OF ILLUSTRATIVE EMBODIMENTS

As discussed above, a time-to-digital converter (TDC) captures the time difference between two signals and produces a digital output value representative of the time difference.

Figure 1:
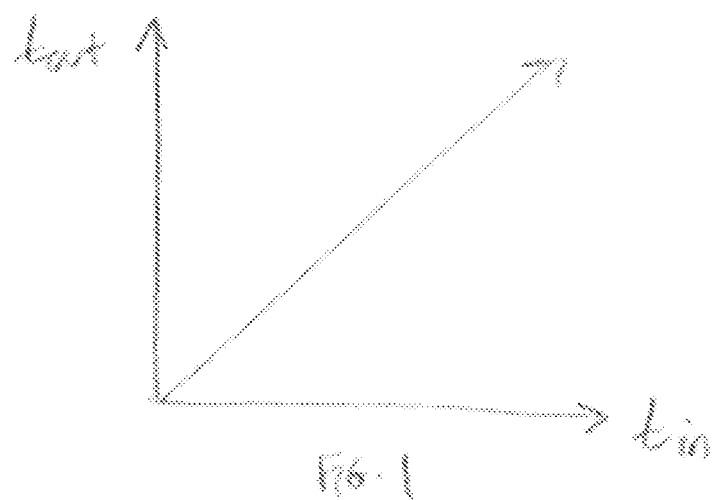
FIG. 1 is a schematic diagram showing a graph representing ideal TDC performance.

FIG. 1 is a schematic diagram showing a graph representing ideal TDC performance. Ideally, the TDC will operate linearly and without any offset or other errors, such that the time value output ($t_{out}$) from the TDC is exactly equal to the time difference ($t_{in}$) between the two input signals across the entire range of TDC inputs. Of course, TDCs, like many other types of circuits, typically do not operate ideally but instead often operate with various types of errors.

Figure 2:
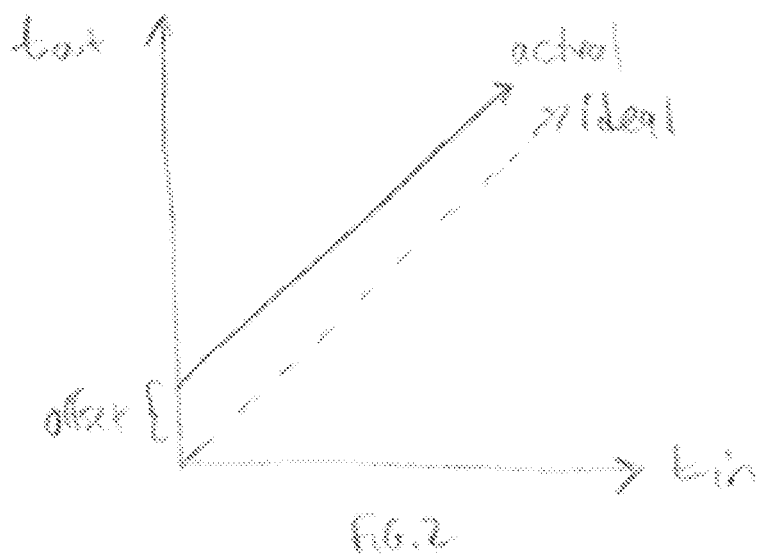
FIG. 2 is a schematic diagram showing a graph representing a form of TDC offset.

FIG. 2 is a schematic diagram showing a graph representing a form of TDC offset. Here, the TDC output is shown as being linear but with an offset, such that the time value output ($t_{out}$) from the TDC is equal to the time difference ($t_{in}$) between the two input signals plus or minus some non-zero offset value across the entire range of TDC inputs.

Figure 3:
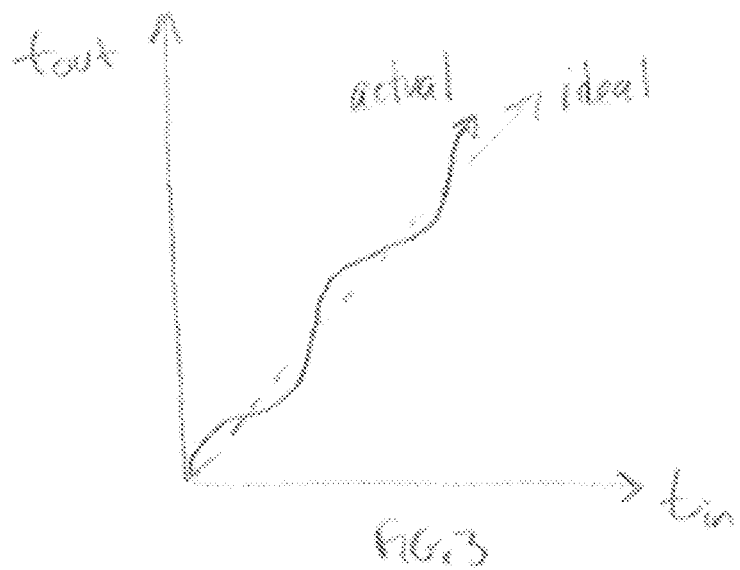
FIG. 3 is a schematic diagram showing a graph representing a form of TDC non-linearity, such that the time value output ($t_{out}$) from the TDC is a non-linear function of the time difference ($t_{in}$) between the two input signals.

FIG. 3 is a schematic diagram showing a graph representing a form of TDC non-linearity, such that the time value output ($t_{out}$) from the TDC is a non-linear function of the time difference ($t_{in}$) between the two input signals.

TDCs can exhibit both offset and non-linearity errors. Furthermore, TDCs generally exhibit quantization error.

Figure 4:
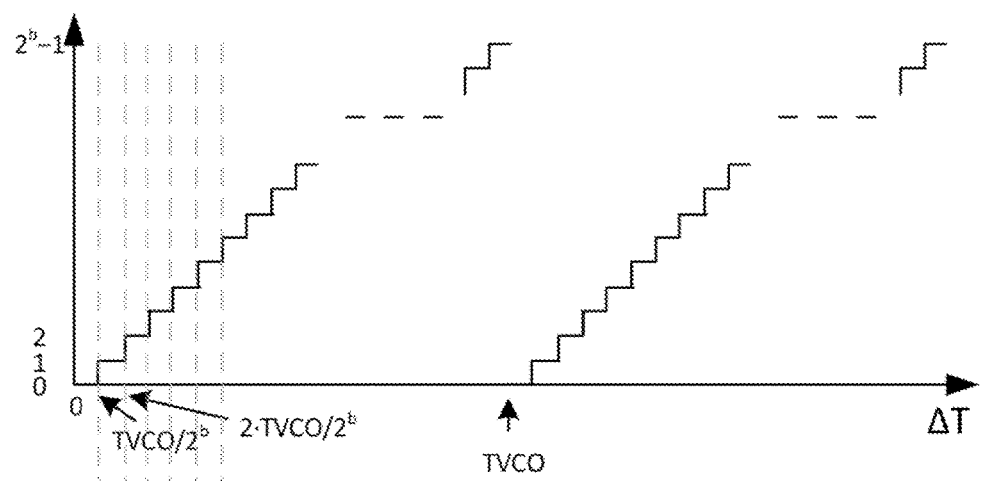
FIG. 4 is a schematic diagram showing a graph representing ideal performance of a b-bit TDC.

FIG. 4 is a schematic diagram showing a graph representing ideal performance of a b-bit TDC.

Figure 5:
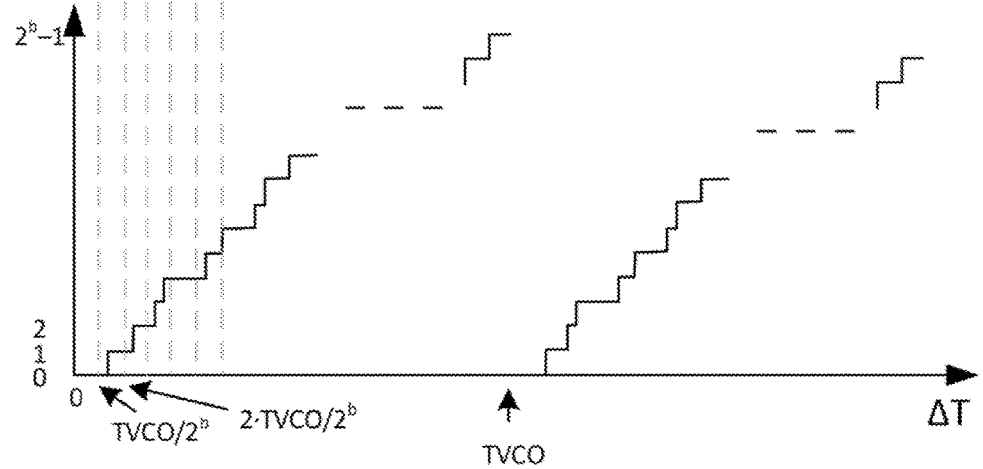
FIG. 5 is a schematic diagram showing a graph representing TDC non-idealities (e.g., offset, gain, non-linearity errors) in a b-bit TDC.

FIG. 5 is a schematic diagram showing a graph representing TDC non-idealities (e.g., offset, gain, non-linearity errors) in a b-bit TDC.

Embodiments of the present invention employ digital post-processing of the TDC output data to map each TDC code to the ideal one, but this requires knowing the TDC input-output mapping. Therefore, embodiments of the present invention also provide a calibration system and method for characterizing operation of a time-to-digital converter (TDC) to compensate for non-idealities. Specifically, input signals having a known time difference are provided to the TDC, and a mapping between the TDC output and the known time difference is stored in a mapping table. With the described method, it is possible to input an input ramp of very low slope to construct this mapping to the desired resolution during a background calibration procedure. This characterizing and mapping can be performed across a range of input signals having different known time differences, e.g., by programming a signal generator to step across all possible offsets. After calibration, the mapping table can be used by a mapping circuit of the TDC or by a digital post-processing function to provide a compensated TDC output. It is envisioned that calibration circuits of the types described herein can be applied generally to any type of TDC.

Figure 6:
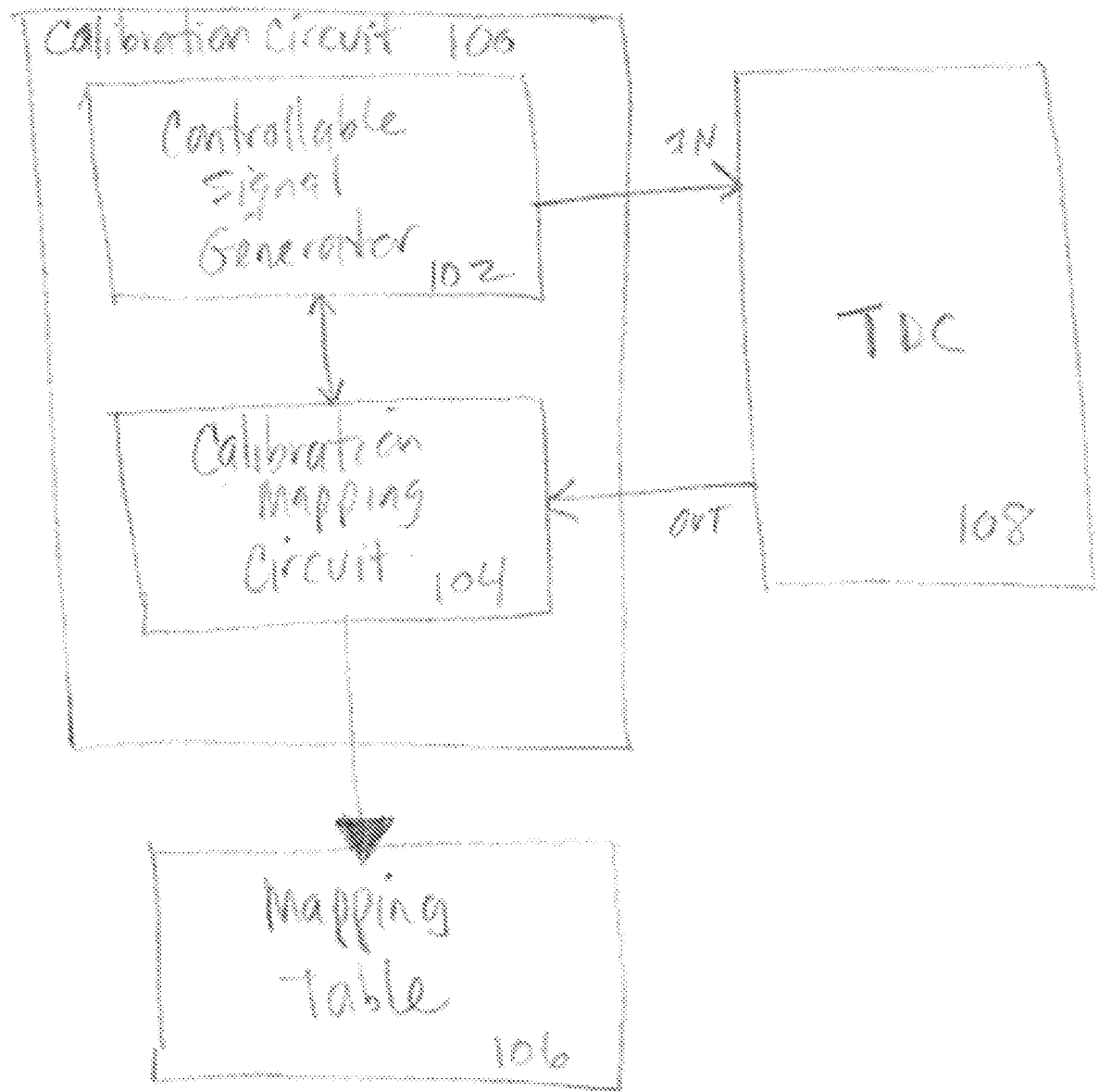
FIG. 6 is a schematic diagram showing a calibration circuit, in accordance with certain exemplary embodiments.

FIG. 6 is a schematic diagram showing a calibration circuit 100, in accordance with certain exemplary embodiments. Among other things, the calibration circuit 100 includes a controllable signal generator 102 and a calibration mapping circuit 104. The controllable signal generator 102 provides input signals having a known time difference to the TDC. Without limitation, the controllable signal generator 102 can include a fractional-N phase-locked loop (PLL), a delayed-locked loop (DLL) and phase-interpolators (PIs), or other controllable signal generator. The calibration mapping circuit 104 stores a mapping between the TDC output and the known time difference in a mapping table 106, e.g., by storing the known time difference in the mapping table such that the table can be indexed by the TDC output value to obtain the known time value. The known time difference stored in the mapping table can be an absolute value or a compensation value to be combined with the TDC output value (e.g., a delta value).

In certain exemplary embodiments, the TDC output is a digital time value representing the time difference measured by the TDC. The calibration mapping circuit 104 can map this digital time value to the known time difference, e.g., by storing the known time difference in the mapping table such that the table can be indexed by the digital time value in order to obtain the known time value, for example, as part of a digital post-processing function.

Figure 7:
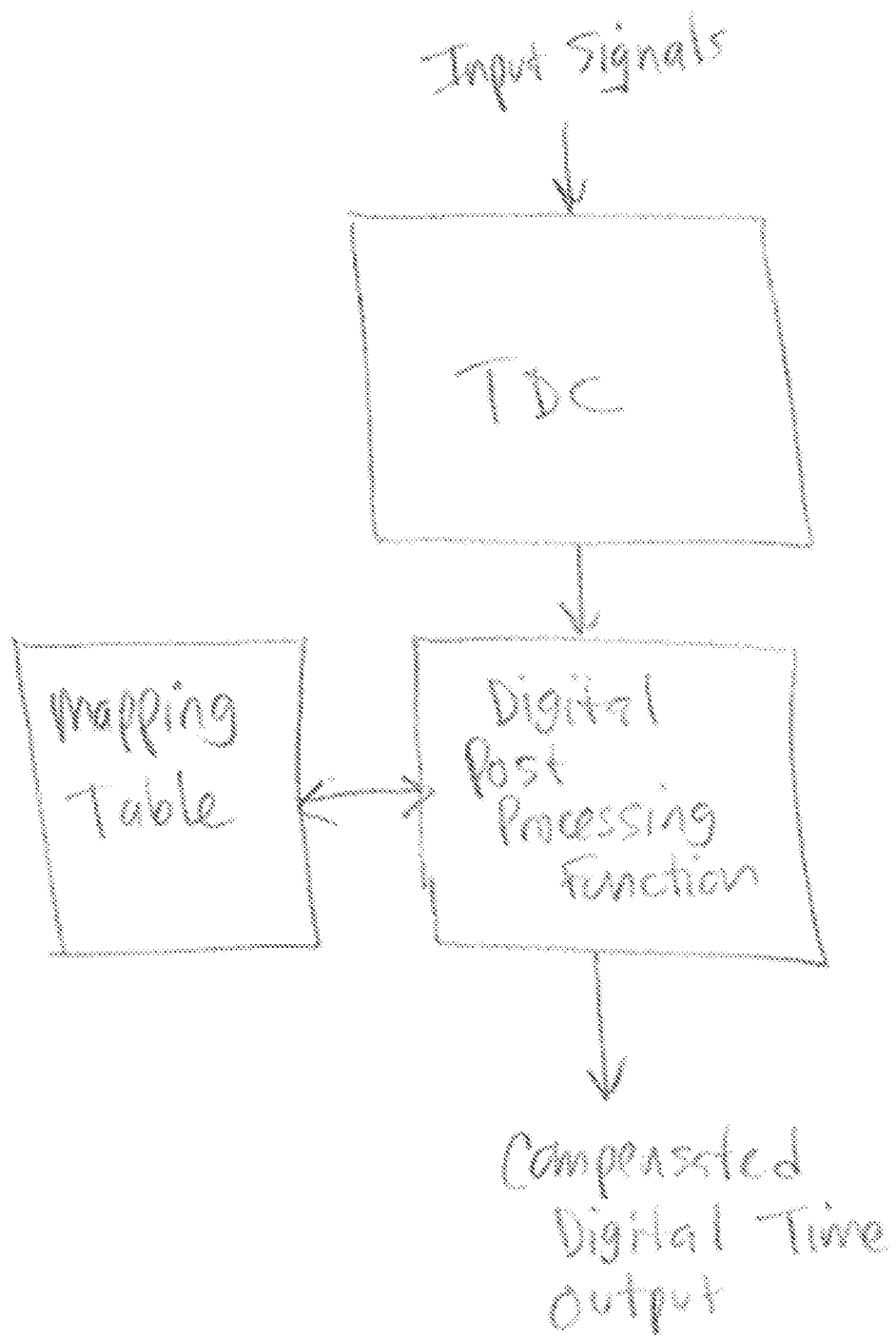
FIG. 7 is a schematic diagram showing compensation by a digital post-processing function, in accordance with certain exemplary embodiments.

FIG. 7 is a schematic diagram showing compensation by a digital post-processing function, in accordance with certain exemplary embodiments. Here, the digital post-processing function receives a digital time output value from the TDC, accesses the mapping table to obtain the corresponding known time value or compensation value, and outputs a compensated digital time output, e.g., the known time value retrieved from the mapping table or the digital time output value adjusted by the compensation value retrieved from the mapping table.

In certain other exemplary embodiments, the TDC output is a digital voltage measurement value such as from TDCs of the type described in 4181-13503, which was incorporated by reference above. Such TDCs use voltage as a representation of time offset, specifically by inducing a voltage change over a time period from a start signal to a stop signal, measuring the final voltage, and mapping the voltage measurement to a time value representing the time between the start signal and the stop signal. The voltage change can be increasing or decreasing, e.g., by charging or discharging a capacitive circuit between the start signal and the stop signal. The voltage can be measured using an analog-to-digital converter (ADC) or other voltage measurement circuit. During calibration, the calibration mapping circuit 104 can map this digital voltage measurement value to the known time difference, e.g., by storing the known time difference in the mapping table such that the table can be indexed by the digital voltage measurement value in order to obtain the known time value.

Figure 8:
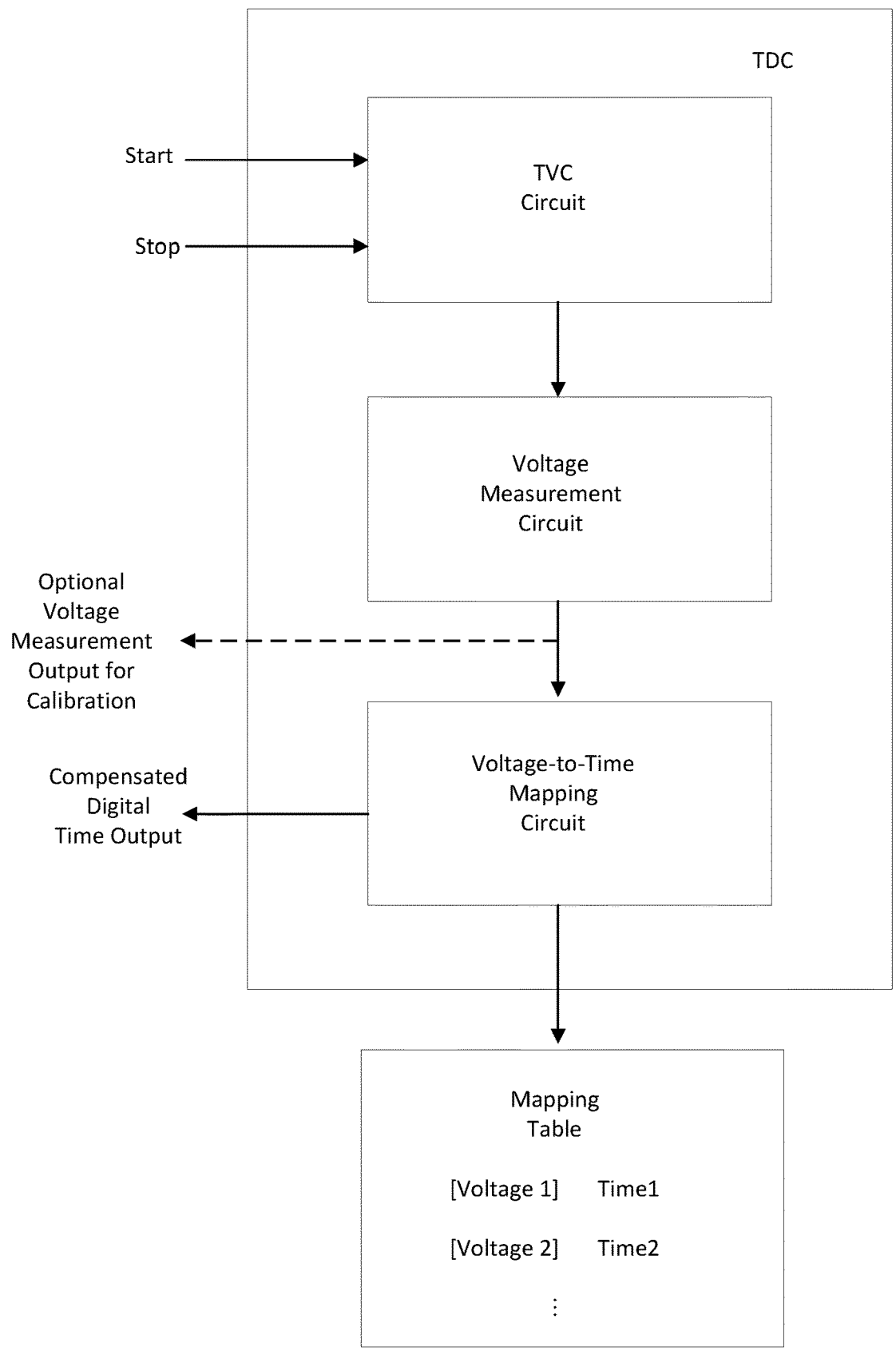
FIG. 8 is a schematic diagram showing a TDC configured to use voltage as a representation of time offset, in accordance with certain exemplary embodiments.

FIG. 8 is a schematic diagram showing a TDC configured to use voltage as a representation of time offset, in accordance with certain exemplary embodiments. Among other things, the TDC includes a time-to-voltage converter (TVC) circuit, a voltage measurement circuit, and a voltage-to-time mapping circuit. During calibration, the TVC circuit induces a voltage change over a time period from a start signal to a stop signal and outputs a voltage signal to the voltage measurement circuit. The voltage measurement circuit outputs a digital voltage measurement value based on the voltage signal, e.g., a digital value representative of the final voltage. This digital voltage measurement value optionally can be provided to an external calibration mapping circuit 104, or the voltage-to-time mapping circuit can be configured to act as the calibration mapping circuit 104 during calibration. In any case, as discussed above, the calibration mapping circuit 104 can map this digital voltage measurement value to the known time difference between the start and stop signals, e.g., by storing the known time difference in the mapping table such that the table can be indexed by the digital voltage measurement value in order to obtain the known time value. During operation of the TDC, the voltage-to-time mapping circuit uses the mapping table to map a digital voltage measurement value to a time value representing the time between the start signal and the stop signal.

In certain exemplary embodiments, the TDC is part of a synthesizer phase measurement circuit that measures the phase/time difference between a reference signal and a corresponding synthesizer output signal, for example, as described in 4181-12901 and 4181-12903, which were incorporated by reference above. For example, certain systems require measuring the phase difference between the outputs of different local oscillators (LOs), where the LOs are generated with fractional-N phase-locked loops (frac-N PLLs) which all share one input reference clock signal. This can be done by measuring the phase difference between each LO and the common reference using a time-to-digital converter (TDC), where the TDC detects the time difference between each reference rising edge and the first PLL output rising edge which follows it. In such embodiments, the existing synthesizer (e.g., a fractional-N PLL) can be used as the controllable signal generator 102 such that no dedicated calibration circuitry such as a delayed-locked loop (DLL) and phase-interpolators (PIs) is needed, thereby requiring less circuitry area, design time, and resources. Instead, simple switching circuitry can be included to selectively switch the synthesizer output(s) to the TDC during calibration.

Figure 9:
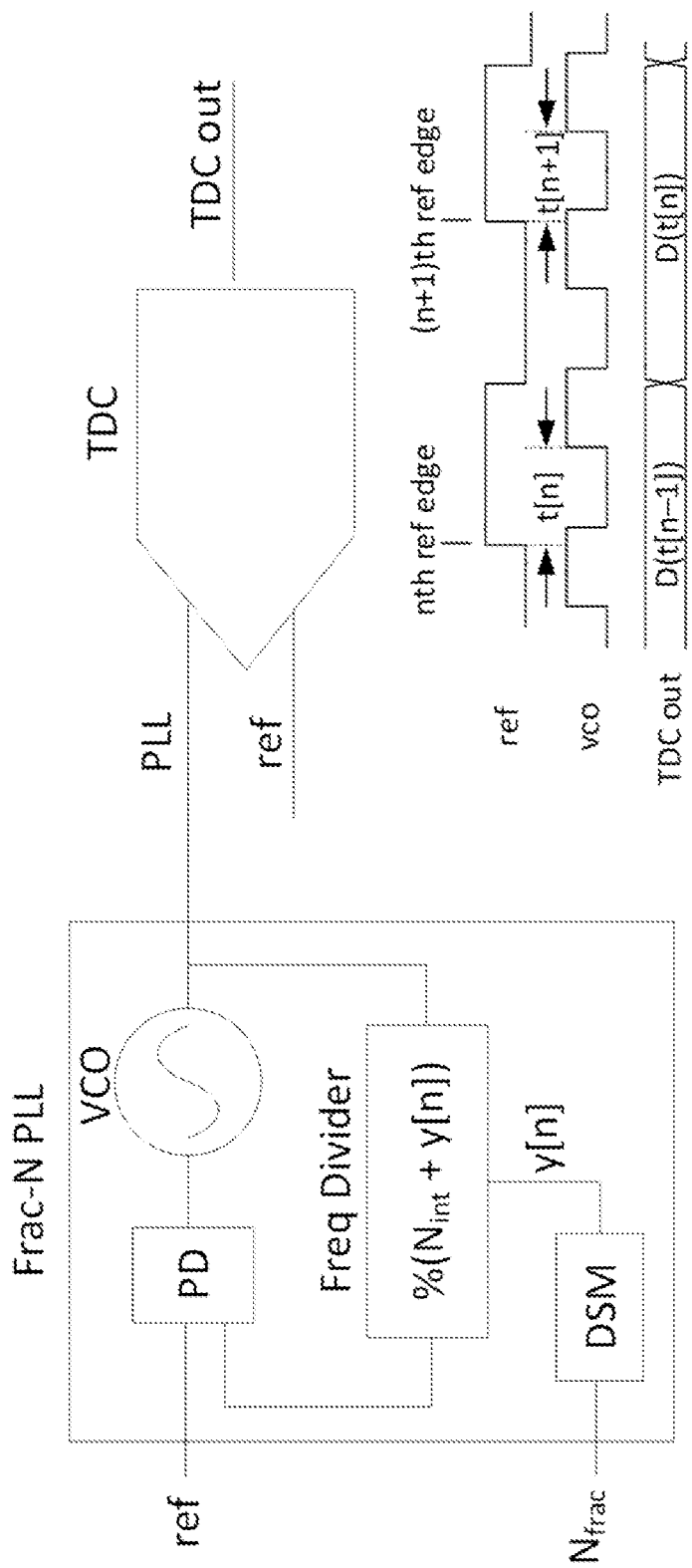
FIG. 9 is a schematic diagram showing use of a fractional-N PLL to sweep the TDC input values as part of a calibration process, in accordance with certain exemplary embodiments.

FIG. 9 is a schematic diagram showing use of a fractional-N PLL to sweep the TDC input values as part of a calibration process, in accordance with certain exemplary embodiments. In this example, the PLL output frequency is given by $f_{PLL}=f_{ref}(N_{int}+N_{frac})$, where $f_{ref}$ is the reference frequency, $N_{int}$ an integer value, and $N_{frac}$ is a fractional value. The TDC input is defined as the time difference between each reference rising edge and the VCO rising edge that follows it. The difference between two consecutive TDC input values (i.e., the TDC input step) is given by mod ($N_{frac} \cdot T_{VCO}, T_{VCO}$). For background calibration, the TDC input can be swept by setting $N_{frac}$ low enough so that the TDC input is a low-slope ramp, where the slope is given by $N_{frac} \cdot T_{VCO}/T_{ref}$.

In certain exemplary embodiments, the circuit shown in FIG. 9 is used for characterization of the TDC for gain and non-linearity, but not for characterization of offset error, as the absolute value of the TDC input (i.e., the absolute value of the time difference between the ref and VCO signals) is not known. Thus, for example, when the fractional-N PLL increases the TDC input step by some known time difference ($\Delta t_{in}$), the calibration process can characterize the corresponding difference in TDC output ($\Delta t_{out}$), but the calibration process does not know the absolute value of the relationship between the ref and VCO signals themselves in that the calibration process does not know where the PLL is going to start relative to the reference signal. Instead, once the calibration process knows one time output, it knows what the next time output should be based on a known TDC input step time difference (e.g., if the first calibration measurement is 50 microseconds and we are sweeping in 10 microsecond increments, then the calibration process would expect the next calibration measurement to be 60 microseconds, but the calibration process does not know if the first calibration measurement was supposed to be 50 microseconds or some other value).

Therefore, in certain exemplary embodiments, to calibrate offset, the clock inputs to the TDC are switched with clock inputs for which there is a known and fixed phase relationship. For example, instead of connecting the reference and VCO (PLL output) to the TDC, the reference and a delayed version of the reference (with known delay) can be connected to the TDC.

Figure 10:
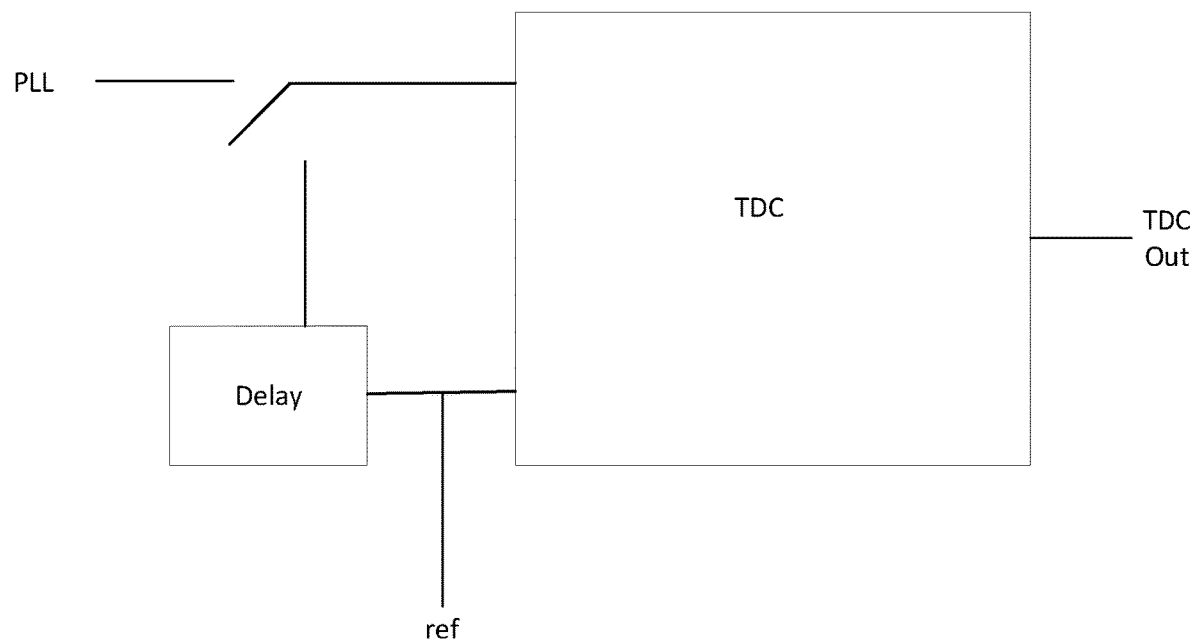
FIG. 10 is a schematic diagram showing a circuit for use in calibrating offset, in accordance with certain exemplary embodiments.

FIG. 10 is a schematic diagram showing a circuit for use in calibrating offset, in accordance with certain exemplary embodiments. Here, a switch is used to selectively connect a delayed version of the ref signal to the TDC for offset calibration. The delay can be provided, for example, using a buffer or other delay circuit. The switch then can be used to connect the PLL output to the TDC following offset calibration, such as for use of the PLL in sweeping the TDC input for further calibration as discussed above.

Thus, calibration processes described herein can be used to calibrate both absolute and relative time measurements. The offset calibration results and gain/non-linearity calibration results can be used together to map and compensate for TDC errors.

It should be noted that the calibration operation can be performed once or at various times, e.g., to compensate for fluctuations that can occur over time such as from component aging, temperature changes, input voltage, etc. The mapping table can be part of the mapping circuit or can be separate from the mapping circuit, e.g., stored in a separate memory. Multiple mapping tables can be maintained, e.g., different mapping tables corresponding to different temperatures, voltages, etc. In this way, for example, the digital post-processing function can be configured to select one of the mapping tables to use, e.g., based on temperature, voltage, etc. Any of the described components, e.g., TDC, post-processing circuitry, calibration circuitry, and/or mapping table(s) can be implemented within an integrated circuit such as an RF integrated circuit.

It should be noted that time-to-digital converters and related calibration and operational systems and methods can be used in a wide variety of applications. Various embodiments can be used in the context of active electronically steered antenna (AESA) systems also called Active Antenna, although the present invention is in no way limited to AESA systems. AESA systems form electronically steerable beams (sometimes referred to as "beam forming" or "BF") that can be used for a wide variety of applications. Generally speaking, a "beam-formed signal" is a signal produced by or from a plurality of beam forming elements. A "beam forming element" (sometimes referred to simply as an "element" or "radiating element") is an element that is used to transmit and/or receive a signal for beam forming. Different types of beam forming elements can be used for different beam forming applications. For example, the beam forming elements may be RF antennas for RF applications (e.g., radar, wireless communication system such as 5G applications, satellite communications, etc.), ultrasonic transducers for ultrasound applications, optical transducers for optical applications, microphones and/or speakers for audio applications, etc. Typically, the signal provided to or from each beam forming element is independently adjustable, e.g., as to gain/amplitude and phase. In the context of the present invention, there is no requirement that a beam-formed signal have any particular characteristics such as directionality or coherency. Although certain details of various embodiments of an AESA system are discussed below, those skilled in the art can apply some embodiments to other AESA systems. Accordingly, discussion of an AESA system does not necessarily limit certain other embodiments.

Figure 11:
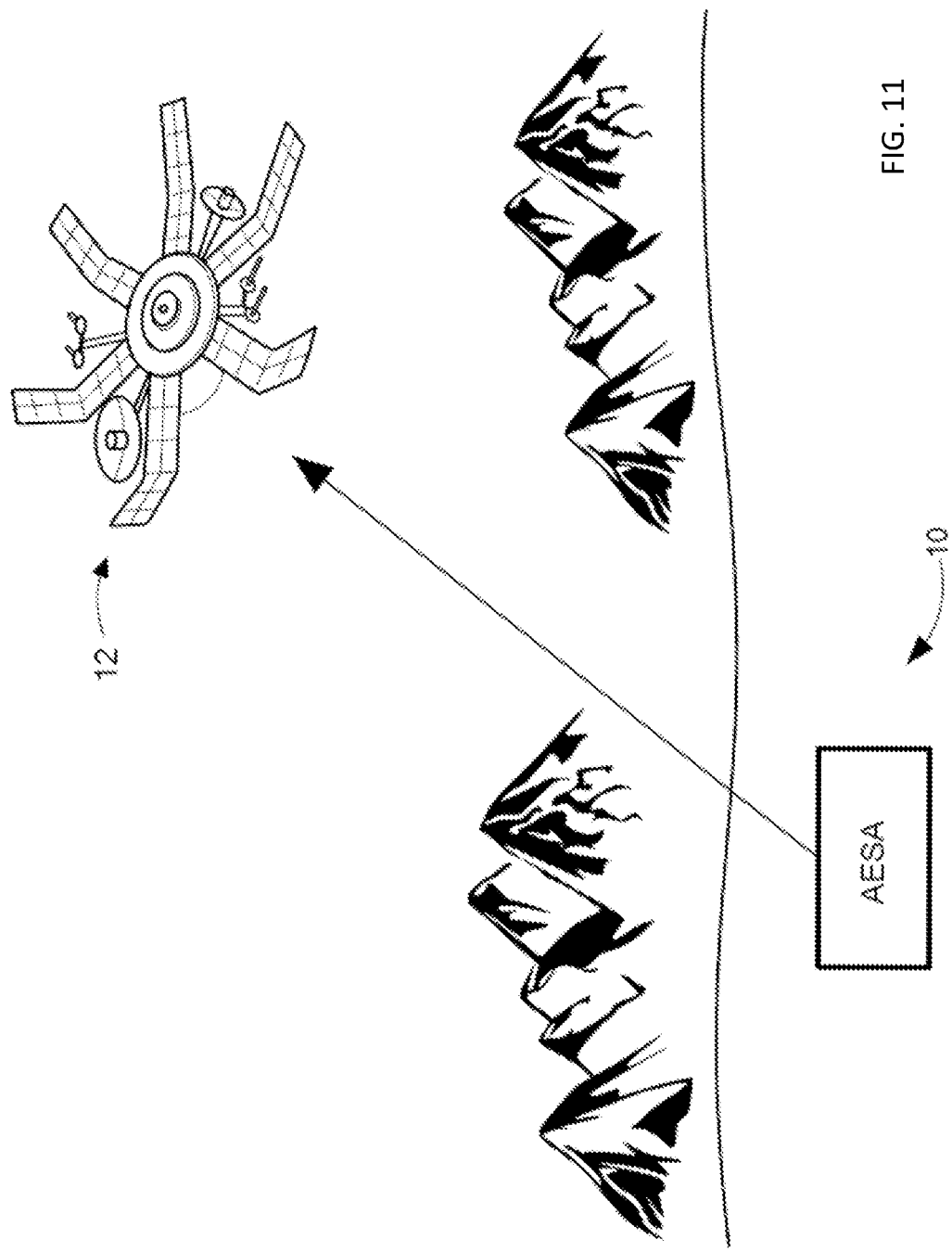
FIG. 11 schematically shows an active electronically steered antenna system ("AESA system") configured in accordance with certain illustrative embodiments of the invention and communicating with an orbiting satellite.

FIG. 11 schematically shows an active electronically steered antenna system ("AESA system 10") configured in accordance with certain illustrative embodiments of the invention and communicating with an orbiting satellite 12. A phased array (discussed in more detail below and referenced as phased array 10A) implements the primary functionality of the AESA system 10. Specifically, as known by those skilled in the art, a phased array is a system that includes a plurality of beam forming elements and related control logic for producing and adapting beam-formed signals to form one or more of a plurality of electronically steerable beams that can be used for a wide variety of applications. As a satellite communication system, for example, the AESA system 10, preferably is configured operate at one or more satellite frequencies. Among others, those frequencies may include the Ka-band, Ku-band, and/or X-band. Of course, as satellite communication technology progresses, future implementations may modify the frequency bands to communicate using new satellite frequencies.

Figure 12:
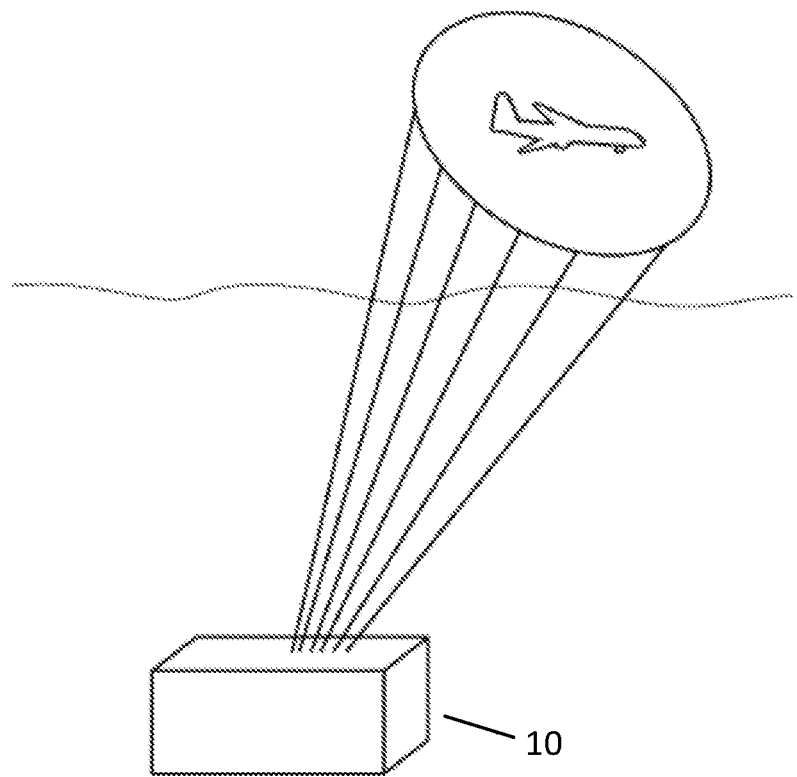
FIG. 12 schematically shows an AESA system configured in accordance with certain illustrative embodiments of the invention and implemented as a radar system in which a beam-formed signal may be directed toward an aircraft or other object in the sky (e.g., to detect or track position of the object).

FIG. 12 schematically shows an AESA system 10 configured in accordance with certain illustrative embodiments of the invention and implemented as a radar system in which a beam-formed signal may be directed toward an aircraft or other object in the sky (e.g., to detect or track position of the object).

Figure 13:
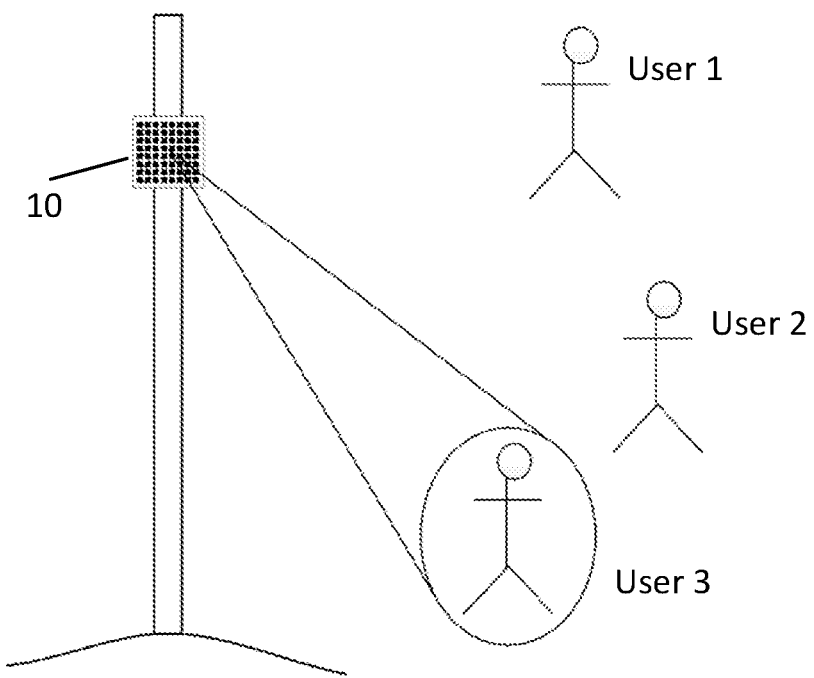
FIG. 13 schematically shows an AESA system configured in accordance with certain illustrative embodiments of the invention and implemented as a wireless communication system (e.g., 5G) in which a beam-formed signal may be directed toward a particular user (e.g., to increase the effective transmit range of the AESA system or to allow for greater frequency reuse across adjacent or nearby cells).

FIG. 13 schematically shows an AESA system 10 configured in accordance with certain illustrative embodiments of the invention and implemented as a wireless communication system (e.g., 5G) in which a beam-formed signal may be directed toward a particular user (e.g., to increase the effective transmit range of the AESA system or to allow for greater frequency reuse across adjacent or nearby cells). Of course, other implementations may include other types of wireless communication systems.

Of course, those skilled in the art use AESA systems 10 and other phased array systems in a wide variety of other applications, such as RF communication, optics, sonar, ultrasound, etc. Accordingly, discussion of satellite, radar, and wireless communication systems are not intended to limit all embodiments of the invention.

The satellite communication system may be part of a cellular network operating under a known cellular protocol, such as the 3G, 4G (e.g., LTE), or 5G protocols. Accordingly, in addition to communicating with satellites, the system may communicate with earth-bound devices, such as smartphones or other mobile devices, using any of the 3G, 4G, or 5G protocols. As another example, the satellite communication system may transmit/receive information between aircraft and air traffic control systems. Of course, those skilled in the art may use the AESA system 10 in a wide variety of other applications, such as broadcasting, optics, radar, etc. Some embodiments may be configured for non-satellite communications and instead communicate with other devices, such as smartphones (e.g., using 4G or 5G protocols). Accordingly, discussion of communication with orbiting satellites 12 is not intended to limit all embodiments of the invention.

In certain exemplary embodiments, the beam forming elements may be implemented as patch antennas that are formed on one side of a laminar printed circuit board, although it should be noted that the present invention is not limited to patch antennas or to a laminar printed circuit board. In exemplary embodiments, a phased array includes X beam forming integrated circuits (BFICs), with each BFIC supporting Y beam forming elements (e.g., 2 or 4 beam forming elements per BFIC, although not limited to 2 or 4). Thus, such a phased array includes (X*Y) beam forming elements.

Figure 14:
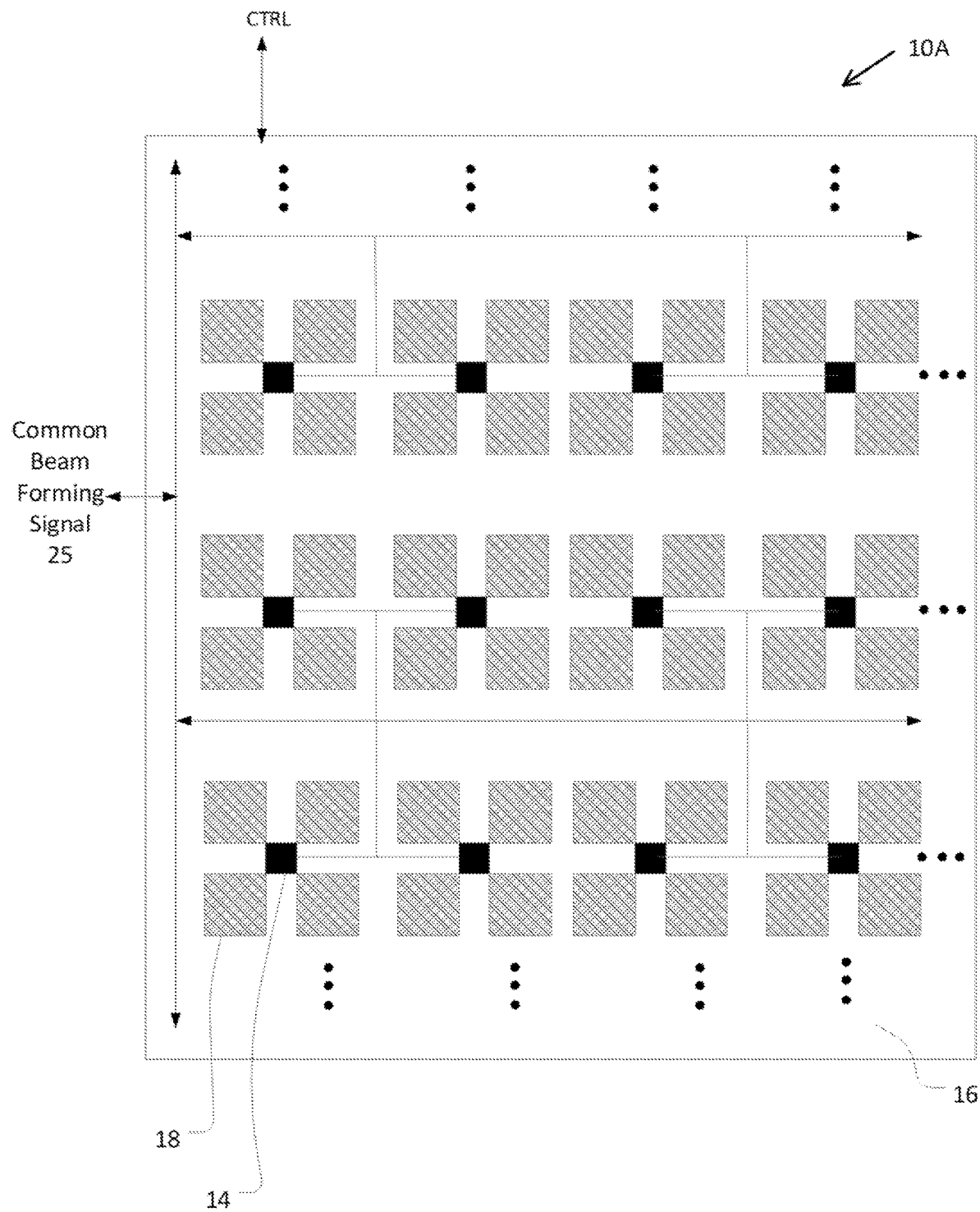
FIG. 14 schematically shows a plan view of a primary portion of an AESA system in which each beam forming integrated circuit (BFIC) is connected to four beam forming elements, in accordance with illustrative embodiments of the invention.
Figure 15:
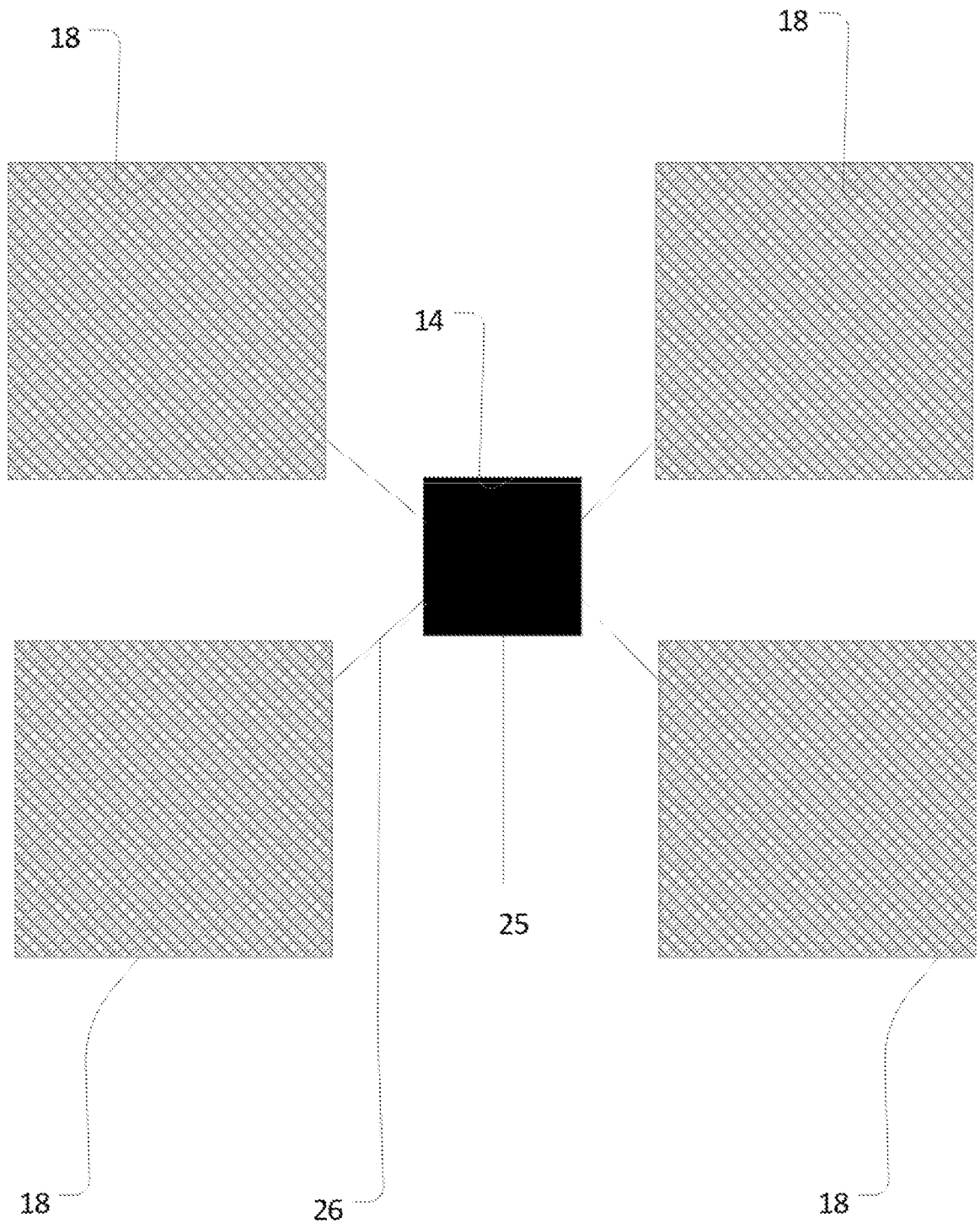
FIG. 15 schematically shows a close-up of a portion of the phased array of FIG. 14.

FIG. 14 schematically shows a plan view of a primary portion of an AESA system 10 in which each beam forming integrated circuit 14 is connected to four beam forming elements 18, in accordance with illustrative embodiments of the invention. Each BFIC 14 aggregates signals to/from the connected beam forming elements as part of a common beam forming signal 25. FIG. 15 schematically shows a close-up of a portion of the phased array 10A of FIG. 14.

Specifically, the AESA system 10 of FIG. 14 is implemented as a laminar phased array 10A having a laminated printed circuit board 16 (i.e., acting as the substrate and also identified by reference number "16") supporting the above noted plurality of beam forming elements 18 and beam forming integrated circuits 14. The elements 18 preferably are formed as a plurality of square or rectangular patch antennas oriented in a patch array configuration. It should be noted that other embodiments may use other patch configurations, such as a triangular configuration in which each integrated circuit is connected to three elements 18, a pentagonal configuration in which each integrated circuit is connected to five elements 18, or a hexagonal configuration in which each integrated circuit is connected to six elements 18. Like other similar phased arrays, the printed circuit board 16 also may have a ground plane (not shown) that electrically and magnetically cooperates with the elements 18 to facilitate operation. In exemplary embodiments, the BFICs are mounted to a back side of the printed circuit board opposite the side containing the patch antennas (e.g., with through-PCB vias and traces that connect to the elements 18, with such connections typically made using impedance controlled lines and transitions), although in alternative embodiments, the BFICs may be mounted to the same side of the printed circuit board as the patch antennas.

As a patch array, the elements 18 have a low profile. Specifically, as known by those skilled in the art, a patch antenna (i.e., the element 18) typically is mounted on a flat surface and includes a flat rectangular sheet of metal (known as the patch and noted above) mounted over a larger sheet of metal known as a "ground plane." A dielectric layer between the two metal regions electrically isolates the two sheets to prevent direct conduction. When energized, the patch and ground plane together produce a radiating electric field. Illustrative embodiments may form the patch antennas using conventional semiconductor fabrication processes, such as by depositing one or more successive metal layers on the printed circuit board 16. Accordingly, using such fabrication processes, each radiating element 18 in the phased array 10A should have a very low profile. It should be noted that embodiments of the present invention are not limited to rectangular-shaped elements 18 but instead any appropriate shape such as circular patches, ring resonator patches, or other shape patches may be used in other particular embodiments.

The phased array 10A can have one or more of any of a variety of different functional types of elements 18. For example, the phased array 10A can have transmit-only elements 18, receive-only elements 18, and/or dual mode receive and transmit elements 18 (referred to as "dual-mode elements 18"). The transmit-only elements 18 are configured to transmit outgoing signals (e.g., burst signals) only, while the receive-only elements 18 are configured to receive incoming signals only. In contrast, the dual-mode elements 18 are configured to either transmit outgoing burst signals, or receive incoming signals, depending on the mode of the phased array 10A at the time of the operation. Specifically, when using dual-mode elements 18, the phased array 10A generally can be in either a transmit mode, or a receive mode.

The AESA system 10 has a plurality of the above noted integrated circuits 14 (mentioned above with regard to FIG. 15) for controlling operation of the elements 18. Those skilled in the art sometimes refer to these integrated circuits 14 as "beam steering integrated circuits." Each integrated circuit 14 preferably is configured with at least the minimum number of functions to accomplish the desired effect. Indeed, integrated circuits 14 for dual mode (transmit and receive) elements 18 are expected to have some different functionality than that of the integrated circuits 14 for transmit-only elements 18 or receive-only elements 18. Accordingly, integrated circuits 14 for such non-dual-mode elements 18 typically have a smaller footprint than the integrated circuits 14 that control the dual-mode elements 18. Despite that, some or all types of integrated circuits 14 fabricated for the phased array 10A can be modified to have a smaller footprint.

As an example, depending on its role in the phased array 10A, each integrated circuit 14 may include some or all of the following functions:
phase shifting,
amplitude controlling/beam weighting,
switching between transmit mode and receive mode,
output amplification to amplify output signals to the elements 18,
input amplification for received RF signals (e.g., signals received from the satellite 12), and
power combining/summing and splitting between elements 18.

Indeed, some embodiments of the integrated circuits 14 may have additional or different functionality, although illustrative embodiments are expected to operate satisfactorily with the above noted functions. Those skilled in the art can configure the integrated circuits 14 in any of a wide variety of manners to perform those functions. For example, the input amplification may be performed by a low noise amplifier, the phase shifting may use conventional active phase shifters, and the switching functionality may be implemented using conventional transistor-based switches. Additional details of the structure and functionality of integrated circuits 14 are discussed below.

In illustrative embodiments, multiple elements 18 share the integrated circuits 14, thus reducing the required total number of integrated circuits 14. This reduced number of integrated circuits 14 correspondingly reduces the cost of the AESA system 10. In addition, more surface area on the top face of the printed circuit board 16 may be dedicated to the elements 18.

To that end, each integrated circuit 14 preferably operates on at least one element 18 in the array and typically operates on a plurality of elements 18. For example, as discussed above, one integrated circuit 14 can operate on two, three, four, five, six, or more different elements 18. Of course, those skilled in the art can adjust the number of elements 18 sharing an integrated circuit 14 based upon the application.

For example, a single integrated circuit 14 can control two elements 18, three elements 18, four elements 18, five elements 18, six elements 18, seven elements 18, eight elements 18, etc., or some range of elements 18. Sharing the integrated circuits 14 between multiple elements 18 in this manner reduces the required total number of integrated circuits 14, correspondingly reducing the required size of the printed circuit board 16 and cost of the system.

As noted above, dual-mode elements 18 may operate in a transmit mode, or a receive mode. To that end, the integrated circuits 14 may generate time division diplex or duplex waveforms so that a single aperture or phased array 10A can be used for both transmitting and receiving. In a similar manner, some embodiments may eliminate a commonly included transmit/receive switch in the side arms (discussed below) of the integrated circuit 14. Instead, such embodiments may duplex at the element 18. This process can be performed by isolating one of the elements 18 between transmit and receive by an orthogonal feed connection. Such a feed connection may eliminate about a 0.8 dB switch loss and improve G/T (i.e., the ratio of the gain or directivity to the noise temperature) by about 1.3 dB for some implementations.

RF interconnect and/or beam forming lines 26 electrically connect the integrated circuits 14 to their respective elements 18. To further minimize the feed loss, illustrative embodiments mount the integrated circuits 14 as close to their respective elements 18 as possible. Specifically, this close proximity preferably reduces RF interconnect line lengths, reducing the feed loss. To that end, each integrated circuit 14 preferably is packaged either in a flip-chipped configuration using wafer level chip scale packaging (WLCSP) or other configuration such as extended wafer level ball-grid-array (eWLB) that supports flip chip, or a traditional package, such as quad flat no-leads package (QFN package).

It should be reiterated that although FIG. 14 shows an exemplary AESA system 10 with some specificity (e.g., specific layouts of the elements 18 and integrated circuits 14), those skilled in the art may apply illustrative embodiments to other implementations. For example, as noted above, each integrated circuit 14 can connect to more or fewer elements 18, or the lattice configuration can be different. Accordingly, discussion of the specific configurations of the AESA system 10 shown in FIG. 14 is for convenience only and not intended to limit all embodiments.

Figure 16:
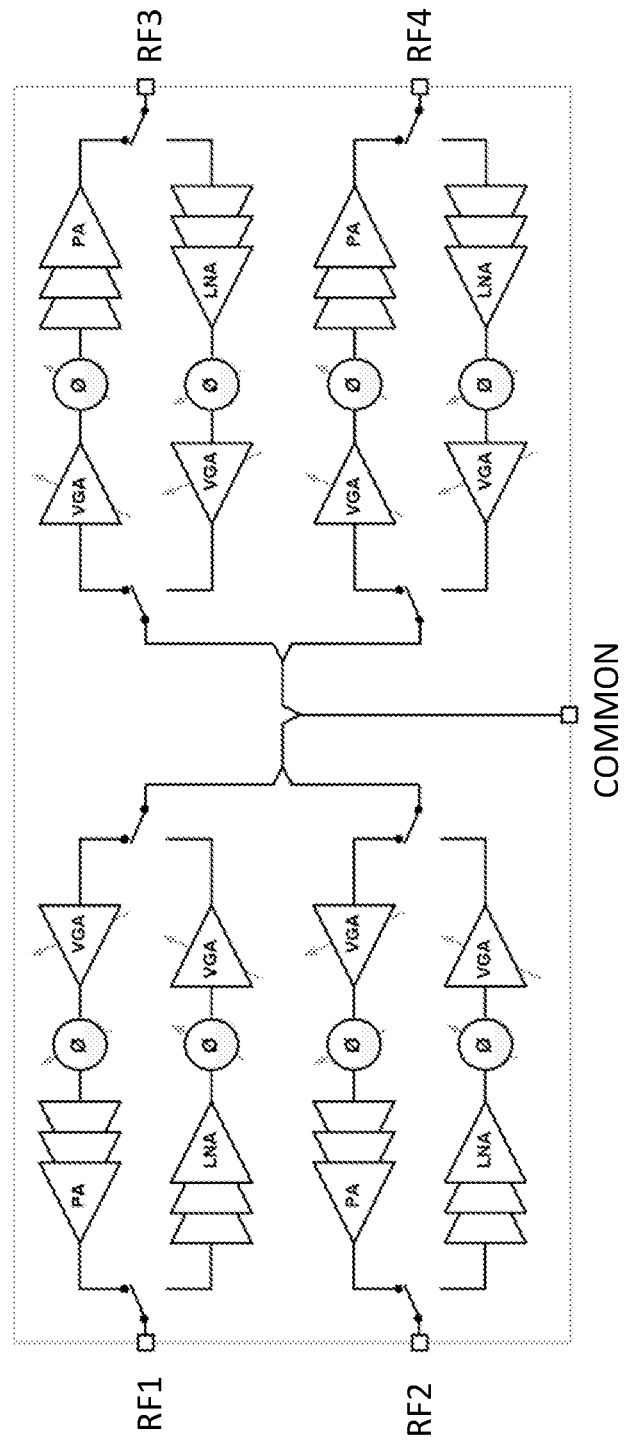
FIG. 16 is a high-level schematic diagram of a four-channel dual-mode BFIC chip in accordance with one exemplary embodiment.

FIG. 16 is a high-level schematic diagram of a four-channel dual-mode BFIC chip in accordance with one exemplary embodiment. Here, each channel has a transmit gain/phase control circuit and a receive gain/phase control circuit that can be switched into and out of the common beam forming signal 25. The transmit gain/phase control circuit includes a variable gain amplifier (VGA), an adjustable phase circuit (Ø), and a power amplifier (PA) stage. The receive gain/phase control circuit includes a low noise amplifier (LNA) stage, an adjustable phase circuit (Ø), and a variable gain amplifier (VGA). In FIG. 16, the BFIC chip is shown with the switches configured in a transmit mode, such that common beam forming signal 25 provided to the BFIC chip is distributed to the four channels. The BFIC chip can be configured in a receive mode by changing the position of the switches, such that signals received on the four channels are output by the BFIC chip as common beam forming signal 25.

Figure 17:
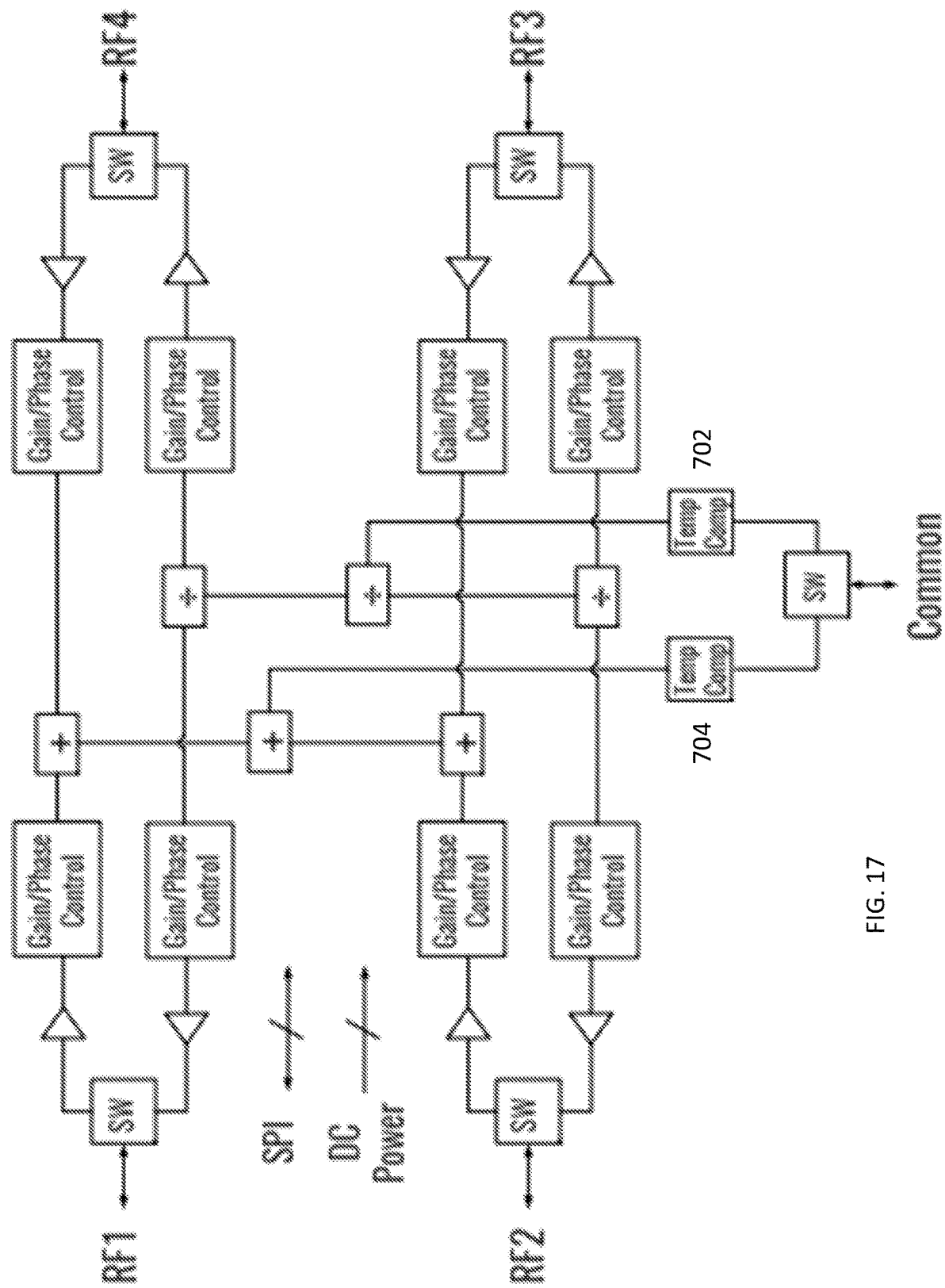
FIG. 17 is a detailed schematic diagram of the BFIC chip of FIG. 16, in accordance with one exemplary embodiment.

FIG. 17 is a detailed schematic diagram of the BFIC chip of FIG. 16, in accordance with one exemplary embodiment. In this exemplary embodiment, the BFIC chip includes temperature compensation (Temp Comp) circuitry to adjust the gain of the transmit and receive signals as a function of temperature based on inputs from a temperature sensor, although alternative embodiments may omit temperature compensation circuitry. In one exemplary embodiment, each Temp Comp circuit includes a digital attenuator that is controlled based on the sensed temperature. Specifically, in this exemplary embodiment, when temperature decreases such that the gain would increase, attenuation is increased in order provide the desired amount of gain, and when temperature increases such that gain would decrease, attenuation is decreased in order to provide the desired amount of gain. In the exemplary embodiment represented in FIG. 17, temperature compensation is performed on the transmit signal prior to distribution to the four RF channels by Temp Comp circuit 702 and is performed on the combined receive signal by Temp Comp circuit 704. In various alternative embodiments, temperature compensation may be performed in other ways, such as, for example, by controlling of the gain of the transmit and receive RF amplifiers.

It should be noted that embodiments of the present invention may employ conventional components such as conventional programmable logic devices (e.g., off-the shelf FPGAs or PLDs) or conventional hardware components (e.g., off-the-shelf ASICs or discrete hardware components) which, when programmed or configured to perform the non-conventional functions described herein, produce non-conventional devices or systems. Thus, there is nothing conventional about the inventions described herein because even when embodiments are implemented using conventional components, the resulting devices and systems (e.g., TDC devices and circuits) are necessarily non-conventional because, absent special programming or configuration, the conventional components do not inherently perform the described non-conventional functions.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Various inventive concepts may be embodied as one or more methods, of which examples have been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Various embodiments of the present invention may be characterized by the potential claims listed in the paragraphs following this paragraph (and before the actual claims provided at the end of the application). These potential claims form a part of the written description of the application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public. Nor are these potential claims intended to limit various pursued claims.

Without limitation, potential subject matter that may be claimed (prefaced with the letter "P" so as to avoid confusion with the actual claims presented below) includes:

P1. A time-to-digital converter (TDC) calibration system comprising an interface to a time-to-digital converter (TDC); a controllable signal generator configured to provide, via the interface, at least one pair of calibration signals to the TDC, each pair of calibration signals having a known time difference; and a calibration mapping circuit configured to receive, via the interface, a digital TDC output value for each pair of calibration signals and to store in a digital memory, for each pair of calibration signals, a mapping value for converting the digital TDC output value to a corresponding digital time value associated with the known time difference.

P2. A system according to claim P1, wherein the digital TDC output value is a time value.

P3. A system according to claim P1, wherein the TDC captures the time difference between the two signals as a voltage and wherein the digital TDC output value is a voltage value.

P4. A system according to claim P1, wherein the controllable signal generator is a fractional-N phased-lock loop.

P5. A system according to claim P1, wherein the controllable signal generator comprises a reference signal generator configured to output a reference signal as a first signal provided to the time-to-digital converter; and a delay circuit configured to output a delayed version of the reference signal as a second signal provided to the time-to-digital converter.

P6. A system according to claim P1, wherein the calibration mapping circuit is configured to store the known time difference as the mapping value such that the known time difference can be obtained using the digital TDC output value.

P7. A system according to claim P1, wherein the calibration mapping circuit is configured to store a compensation value based on the known time difference and the digital TDC output value as the mapping value such that the compensation value can be obtained using the digital TDC output value.

P8. A system according to claim P1, wherein the controllable signal generator is configured to provide multiple pairs of calibration signals having different known time differences to the TDC.

P9. A system according to claim P1, wherein the TDC is implemented in an integrated circuit and wherein the calibration mapping circuit is configured to store the mapping values in a digital memory of the integrated circuit.

P10. A system according to claim P1, wherein the calibration mapping circuit is configured to store the mapping value for each pair of calibration signals in a mapping table such that the mapping table can be indexed by a subsequent digital TDC output value to retrieve the stored mapping value.

P11. A time-to-digital converter (TDC) calibration method comprising providing, by a controllable signal generator, at least one pair of calibration signals to a time-to-digital converter (TDC), each pair of calibration signals having a known time difference; receiving, by a calibration mapping circuit, a digital TDC output value for each pair of calibration signals; and storing, by the calibration mapping circuit, in a digital memory, a mapping value for converting the digital TDC output value to a corresponding digital time value associated with the known time difference.

P12. A method according to claim P11, wherein the digital TDC output value is a time value.

P13. A method according to claim P11, wherein the TDC captures the time difference between the two signals as a voltage and wherein the digital TDC output value is a voltage value.

P14. A method according to claim P11, wherein the controllable signal generator is a fractional-N phased-lock loop.

P15. A method according to claim P11, wherein the controllable signal generator comprises a reference signal generator configured to output a reference signal as a first signal provided to the time-to-digital converter; and a delay circuit configured to output a delayed version of the reference signal as a second signal provided to the time-to-digital converter.

P16. A method according to claim P11, wherein storing the mapping value comprises storing the known time difference as the mapping value such that the known time difference can be obtained using the digital TDC output value.

P17. A method according to claim P11, wherein storing the mapping value comprises storing a compensation value based on the known time difference and the digital TDC output value as the mapping value such that the mapping value can be obtained using the digital TDC output value.

P18. A method according to claim P11, wherein providing at least one pair of calibration signals comprises providing multiple pairs of calibration signals having different known time differences to the TDC.

P19. A method according to claim P11, wherein the TDC is implemented in an integrated circuit and wherein storing the mapping values comprises storing the mapping values in a digital memory of the integrated circuit.

P20. A method according to claim P11, wherein storing the mapping values comprises storing the mapping values for each pair of calibration signals in a mapping table such that the mapping table can be indexed by a subsequent digital TDC output value to retrieve the stored mapping value.

P21. A time-to-digital conversion system comprising a time-to-digital converter (TDC) that outputs a digital TDC output value based on two input signals having an unknown time difference; and digital post-processing circuitry coupled to receive the digital TDC output value from the TDC, retrieve from a digital memory a mapping value corresponding to the digital TDC output value based on the digital TDC output value, and output a compensated digital time value based on the mapping value, wherein the compensated digital time value is representative of the unknown time difference between the two input signals.

P22. A system according to claim P21, wherein the digital TDC output value is a time value.

23. A system according to claim P21, wherein the TDC captures the time difference between the two signals as a voltage and wherein the digital TDC output value is a voltage value.

P24. A system according to claim P21, wherein the mapping value retrieved from the digital memory is a known time difference corresponding to the digital TDC output value and wherein the digital post-processing circuitry is configured to output the retrieved known time difference as the compensated digital time value.

P25. A system according to claim P21, wherein the mapping value retrieved from the digital memory is a compensation value corresponding to the digital TDC output value and wherein the digital post-processing circuitry is configured to output the compensated digital time value as a function of the digital TDC output value and the retrieved compensation value.

P26. A system according to claim P21, wherein the mapping values are stored in a mapping table that is indexed by the digital TDC output value to retrieve the stored mapping value.

P27. A system according to claim P21, wherein the TDC and digital post-processing circuitry are implemented in an integrated circuit.

P28. A time-to-digital conversion method comprising receiving, from a time-to-digital converter (TDC), a digital TDC output value based on two input signals having an unknown time difference; retrieving, from a digital memory, a mapping value corresponding to the digital TDC output value based on the digital TDC output value; and outputting a compensated digital time value based on the mapping value, wherein the compensated digital time value is representative of the unknown time difference between the two input signals.

P29. A method according to claim P28, wherein the digital TDC output value is a time value.

P30. A method according to claim P28, wherein the TDC captures the time difference between the two signals as a voltage and wherein the digital TDC output value is a voltage value.

P31. A method according to claim P28, wherein the mapping value retrieved from the digital memory is a known time difference corresponding to the digital TDC output value and wherein outputting the compensated digital time value comprises outputting the retrieved known time difference as the compensated digital time value.

P32. A method according to claim P28, wherein the mapping value retrieved from the digital memory is a compensation value corresponding to the digital TDC output value and wherein outputting the compensated digital time value comprises outputting the compensated digital time value as a function of the digital TDC output value and the retrieved compensation value.

P33. A method according to claim P28, wherein the mapping values are stored in a mapping table that is indexed by the digital TDC output value to retrieve the stored mapping value.

In any of the above potential claims, the calibration and mapping process can be performed for multiple operational parameters such as temperature, voltage, etc., such that there are different mapping tables for different operational parameters. Then, for example, in order to provide a compensated digital time value, the proper mapping table can be selected based on the operational parameter and then the mapping value can be obtained using the digital TDC output value.

Although the above discussion discloses various exemplary embodiments of the invention, it should be apparent that those skilled in the art can make various modifications that will achieve some of the advantages of the invention without departing from the true scope of the invention. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:

1. A time-to-digital converter (TDC) calibration system comprising:
   an interface to a time-to-digital converter (TDC);
   a controllable signal generator configured to provide, via the interface, multiple pairs of calibration signals having different known time differences to the TDC, each pair of calibration signals having a known time difference; and
   a calibration mapping circuit configured to receive, via the interface, a digital TDC output value for each pair of calibration signals and to store in a digital memory, for each pair of calibration signals, a mapping value for converting the digital TDC output value to a corresponding digital time value associated with the known time difference.

2. A system according to claim 1, wherein the digital TDC output value is one of (a) a time value or (b) a voltage value.

3. A system according to claim 1, wherein the controllable signal generator includes one of (a) a fractional-N phased-lock loop or (b) a reference signal generator configured to output a reference signal as a first signal provided to the time-to-digital converter and a delay circuit configured to output a delayed version of the reference signal as a second signal provided to the time-to-digital converter.

4. A system according to claim 1, wherein the calibration mapping circuit is configured to store one of (a) the known time difference as the mapping value such that the known time difference can be obtained using the digital TDC output value or (b) a compensation value based on the known time difference and the digital TDC output value as the mapping value such that the compensation value can be obtained using the digital TDC output value.

5. A system according to claim 1, wherein the TDC is implemented in an integrated circuit and wherein the calibration mapping circuit is configured to store the mapping values in a digital memory of the integrated circuit.

6. A system according to claim 1, wherein the calibration mapping circuit is configured to store the mapping value for each pair of calibration signals in a mapping table such that the mapping table can be indexed by a subsequent digital TDC output value to retrieve the stored mapping value.

7. A time-to-digital converter (TDC) calibration method comprising:
   providing, by a controllable signal generator, multiple pairs of calibration signals having different known time differences to a TDC, each pair of calibration signals having a known time difference;
   receiving, by a calibration mapping circuit, a digital TDC output value for each pair of calibration signals; and
   storing, by the calibration mapping circuit, in a digital memory, a mapping value for converting the digital TDC output value to a corresponding digital time value associated with the known time difference.

8. A method according to claim 7, wherein the digital TDC output value is one of (a) a time value or (b) a voltage value.

9. A method according to claim 7, wherein the controllable signal generator includes one of (a) a fractional-N phased-lock loop or (b) a reference signal generator configured to output a reference signal as a first signal provided to the time-to-digital converter and a delay circuit configured to output a delayed version of the reference signal as a second signal provided to the time-to-digital converter.

10. A method according to claim 7, wherein storing the mapping value comprises one of (a) storing the known time difference as the mapping value such that the known time difference can be obtained using the digital TDC output value or (b) storing a compensation value based on the known time difference and the digital TDC output value as the mapping value such that the mapping value can be obtained using the digital TDC output value.

11. A method according to claim 7, wherein the TDC is implemented in an integrated circuit and wherein storing the mapping values comprises storing the mapping values in a digital memory of the integrated circuit.

12. A method according to claim 7, wherein storing the mapping values comprises storing the mapping values for each pair of calibration signals in a mapping table such that the mapping table can be indexed by a subsequent digital TDC output value to retrieve the stored mapping value.

13. A system according to claim 1, further comprising:
   the time-to-digital converter (TDC); and
   digital post-processing circuitry coupled to receive a digital TDC output value from the TDC based on two input signals having an unknown time difference, retrieve from the digital memory a mapping value corresponding to the digital TDC output value based on the digital TDC output value, and output a compensated digital time value based on the mapping value, wherein the compensated digital time value is representative of the unknown time difference between the two input signals.

14. A system according to claim 13, wherein the digital TDC output value is one or (a) a time value or (b) a voltage value.

15. A system according to claim 13, wherein the mapping value retrieved from the digital memory is one of (a) a known time difference corresponding to the digital TDC output value and wherein the digital post-processing circuitry is configured to output the retrieved known time difference as the compensated digital time value or (b) a compensation value corresponding to the digital TDC output value and wherein the digital post-processing circuitry is configured to output the compensated digital time value as a function of the digital TDC output value and the retrieved compensation value.

16. A system according to claim 13, wherein the mapping values are stored in a mapping table that is indexed by the digital TDC output value to retrieve the stored mapping value.

17. A system according to claim 13, wherein the TDC and digital post-processing circuitry are implemented in an integrated circuit.

18. A method according to claim 7, further comprising:
receiving, from the time-to-digital converter (TDC), a digital TDC output value based on two input signals having an unknown time difference;
retrieving, from the digital memory, a mapping value corresponding to the digital TDC output value based on the digital TDC output value; and
outputting a compensated digital time value based on the mapping value, wherein the compensated digital time value is representative of the unknown time difference between the two input signals.

19. A method according to claim 18, wherein the digital TDC output value is one or (a) a time value or (b) a voltage value.

20. A method according to claim 18, wherein the mapping value retrieved from the digital memory is one of (a) a known time difference corresponding to the digital TDC output value and wherein the digital post-processing circuitry is configured to output the retrieved known time difference as the compensated digital time value or (b) a compensation value corresponding to the digital TDC output value and wherein the digital post-processing circuitry is configured to output the compensated digital time value as a function of the digital TDC output value and the retrieved compensation value.

21. A method according to claim 18, wherein the mapping values are stored in a mapping table that is indexed by the digital TDC output value to retrieve the stored mapping value.

* * * * *